(12) United States Patent
Park

(10) Patent No.: US 9,240,567 B2
(45) Date of Patent: Jan. 19, 2016

(54) ORGANIC LIGHT EMITTING DISPLAY APPARATUS AND METHOD OF MANUFACTURING THE SAME

(71) Applicant: LG Display Co., Ltd., Seoul (KR)

(72) Inventor: Jong Hyun Park, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 9 days.

(21) Appl. No.: 14/542,837

(22) Filed: Nov. 17, 2014

(65) Prior Publication Data

US 2015/0144912 A1    May 28, 2015

(30) Foreign Application Priority Data

Nov. 26, 2013 (KR) .................. 10-2013-0144839

(51) Int. Cl.
*H01L 51/54* (2006.01)
*H01L 51/52* (2006.01)
*H01L 27/32* (2006.01)

(52) U.S. Cl.
CPC ........ *H01L 51/5256* (2013.01); *H01L 27/3244* (2013.01); *H01L 51/5293* (2013.01); *H01L 2227/323* (2013.01)

(58) Field of Classification Search
CPC . H01L 51/5256; H01L 27/3244; H01L 51/56; H01L 2227/323
See application file for complete search history.

(56) References Cited

U.S. PATENT DOCUMENTS

| 2009/0142256 A1 | 6/2009 | Wakayama et al. |
| 2010/0112270 A1 | 5/2010 | Bulliard et al. |
| 2011/0052821 A1 | 3/2011 | Ishizuka et al. |
| 2011/0201201 A1* | 8/2011 | Arnold et al. .................. 438/694 |
| 2012/0223053 A1* | 9/2012 | Millward et al. ............... 216/55 |
| 2013/0059155 A1 | 3/2013 | Choi et al. |
| 2014/0062290 A1* | 3/2014 | Kim .............................. 313/504 |
| 2014/0159074 A1 | 6/2014 | Isobe |
| 2014/0252342 A1* | 9/2014 | Ramadas et al. ................ 257/40 |

FOREIGN PATENT DOCUMENTS

| JP | 2009-138014 A | 6/2009 |
| JP | 2011-045838 A | 3/2011 |
| KR | 10-2012-0133279 A | 12/2012 |
| SG | WO2013062486 * | 5/2013 ............. H05B 33/04 |
| WO | 2013/031162 A1 | 3/2015 |

* cited by examiner

*Primary Examiner* — Donald Raleigh
(74) *Attorney, Agent, or Firm* — Morgan, Lewis & Bockius LLP

(57) ABSTRACT

Provided are an organic light emitting display apparatus and a method of manufacturing the same. The organic light emitting display apparatus includes: a thin film transistor (TFT) substrate including a plurality of thin film transistors, an organic light-emissive device on the TFT substrate, and an encapsulation layer on the TFT substrate and the organic light-emissive device, the encapsulation layer being configured to cover the organic light-emissive device, the encapsulation layer including a hybrid material including: a block copolymer, and functionalized graphene.

12 Claims, 8 Drawing Sheets

ORGANIC LIGHT EMITTING DISPLAY APPARATUS AND METHOD OF MANUFACTURING THE SAME

CROSS-REFERENCE TO RELATED APPLICATION(S)

The present application claims benefit and priority under 35 U.S.C. §119(a) of Korean Patent Application No. 10-2013-0144839, filed on Nov. 26, 2013, the entire disclosure of which is hereby incorporated by reference herein for all purposes.

BACKGROUND

1. Technical Field

The following description relates to an organic light emitting display apparatus and a method of manufacturing the same.

2. Discussion of the Related Art

As a type of flat panel display apparatus, liquid crystal display (LCD) apparatuses are being the most widely used at present. However, the LCD apparatuses are non-emissive devices that cannot self-emit light, and thus have problems in terms of brightness, a contrast ratio, and a viewing angle range.

As flat panel display apparatuses for overcoming the problems of the LCD apparatuses, organic light emitting display apparatuses are attracting much attention. The organic light emitting display apparatuses are emissive devices that self-emit light, and thus have relatively better brightness, contrast ratio, and viewing angle range than those of the non-emissive devices. Also, because the organic light emitting display apparatuses do not need a separate backlight, the organic light emitting display apparatuses are implemented to have a lighter weight, a thinner thickness, and lower power consumption compared to the LCD apparatuses.

An organic light emitting display apparatus fundamentally includes a thin film transistor (TFT), a first electrode electrically connected to the TFT, a light-emissive organic layer on the first electrode, and a second electrode on the light-emissive organic layer. Because the light-emissive organic layer is vulnerable to water and oxygen, a structure (hereinafter referred to as an "encapsulation structure") for protecting the light-emissive organic layer from external water or oxygen is needed for preventing a light-emissive defect which is caused by water or oxygen penetrating into the light-emissive organic layer.

FIGS. 1 to 3 are a cross-sectional views of related art organic light emitting display apparatuses having different encapsulation structures (hereinafter referred to as first to third-type encapsulation structures).

As illustrated in FIGS. 1 to 3, the organic light emitting display apparatuses have the same configuration in that the organic light emitting display apparatuses include a TFT substrate 10 including a plurality of TFTs (not shown) and an organic light-emissive device 20 on the TFT substrate 10. A plurality of the organic light-emissive devices 20 have the same configuration in that each of the organic light-emissive devices 20 includes: a first electrode 21 that is formed on the TFT substrate 10 to be electrically connected to the TFT; a bank layer 22 that is formed on the TFT substrate 10 with the first electrode 21 formed thereon, and includes a bank hole which exposes at least one portion of the first electrode 21 corresponding to a light-emissive area; a light-emissive organic layer 23 that is formed on a portion of the first electrode 21 exposed through the bank hole of the bank layer 22; and a second electrode 24 that is formed on the light-emissive organic layer 23.

However, as illustrated in FIG. 1, the first-type encapsulation structure includes: an encapsulation glass 31 that is separated from the organic light-emissive device 20 by a certain distance; and a frit layer 32 that is disposed between the TFT substrate 10 and the encapsulation glass 31 and at an edge of the organic light emitting display apparatus.

According to the first-type encapsulation structure, the encapsulation glass 31 mainly prevents oxygen/water from penetrating into the light-emissive organic layer 23 through a face of the organic light emitting display apparatus, and the frit layer 32 mainly prevents oxygen/water from penetrating into the light-emissive organic layer 23 through a side of the organic light emitting display apparatus. However, the organic light emitting display apparatus having the first-type encapsulation structure is vulnerable to an external impact, and it is impossible to implement the organic light emitting display apparatus as a flexible display apparatus.

To overcome the drawbacks of the first-type encapsulation structure, the second-type and third-type encapsulation substructures have been proposed.

According to the second-type encapsulation structure, as illustrated in FIG. 2, a protective layer 40 is formed on the TFT substrate 10 with the organic light-emissive device 20 formed thereon to entirely cover the organic light-emissive device 20, and an encapsulation plate 60 is adhered onto the TFT substrate 10 with the protective layer 40 formed thereon through an adhesive layer 50. The protective layer 40 includes: a first inorganic layer 41 that entirely covers the organic light-emissive device 20; an organic layer 42 on the first inorganic layer 41; and a second inorganic layer 43 on the organic layer 42.

According to the second-type encapsulation structure, the encapsulation plate 60 and the protective layer 40 mainly prevent oxygen/water from penetrating into the light-emissive organic layer 23 through a face of the organic light emitting display apparatus, and the protective layer 40 (in particular, the first inorganic layer 41) mainly prevents oxygen/water from penetrating into the light-emissive organic layer 23 through a side of the organic light emitting display apparatus.

According to the third-type encapsulation structure, as illustrated in FIG. 3, a plurality of inorganic thin films 71 to 76 and a plurality of organic thin films 81 to 85 are alternately formed on the TFT substrate 10 with the organic light-emissive device 20 to entirely cover the organic light-emissive device 20. According to the third-type encapsulation structure, the inorganic thin films 71 to 76 and the organic thin films 81 to 85 mainly prevent oxygen/water from penetrating into the light-emissive organic layer 23 through a face of the organic light emitting display apparatus. On the other hand, the inorganic thin film 71 mainly prevents oxygen/water from penetrating into the light-emissive organic layer 23 through a side of the organic light emitting display apparatus.

The above-described second-type encapsulation structure enables a thickness of the organic light emitting display apparatus to be greatly reduced, and enables a flexible display apparatus to be realized. However, because the encapsulation plate 60 cannot substantially contribute to preventing oxygen/water from penetrating in a direction parallel to the TFT substrate 10, the light-emissive organic layer 23 is exposed to oxygen/water, and for this reason, there is a relatively high possibility that a quality of the organic light emitting display apparatus is degraded. Also, it is required to use chemical vapor deposition (CVD)/atomic layer deposition (ALD)

equipment and coating equipment for forming the first and second inorganic layers 41 and 43 and the organic layer 42, causing an increase in manufacturing cost.

The above-described third-type encapsulation structure uses a flexibility of the organic thin film and a cutoff of water by the inorganic thin film. In order to realize all merits of the organic thin films and the inorganic thin films, the organic thin films and the inorganic thin films are alternately formed. This makes the manufacturing process complicated, extends manufacturing time, and more severely increases cost. Also, because oxygen and water can easily penetrate along an interface of each of the thin films (similarly to the second-type encapsulation structure) the third-type encapsulation structure is also vulnerable to penetration of oxygen/water in the direction parallel to the TFT substrate 10.

SUMMARY

Accordingly, embodiments of the present application are directed to an organic light emitting display apparatus and a method of manufacturing the same that substantially obviate one or more problems due to limitations and disadvantages of the related art.

An object of embodiments is to provide an organic light emitting display apparatus which has an excellent cutoff of water/oxygen and good flexibility, and is manufactured through a relatively simple process at relatively low cost.

Another object of embodiments is to provide a method of manufacturing an organic light emitting display apparatus, having an excellent cutoff of water/oxygen and good flexibility, through a relatively simple process at relatively low cost.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose according to one aspect of the invention, an organic light emitting display apparatus, includes: a thin film transistor (TFT) substrate including a plurality of thin film transistors, an organic light-emissive device on the TFT substrate, and an encapsulation layer on the TFT substrate and the organic light-emissive device, the encapsulation layer being configured to cover the organic light-emissive device, the encapsulation layer including a hybrid material including: a block copolymer, and functionalized graphene.

In another aspect, a method of manufacturing an organic light emitting display apparatus includes: preparing a substrate including a plurality of thin film transistors, providing an organic light-emissive device on the substrate, providing a protective layer on the substrate and the organic light-emissive device to cover the organic light-emissive device, and forming an encapsulation layer on the substrate and the protective layer to cover the protective layer, the forming of the encapsulation layer including: mixing functionalized graphene and a block copolymer in a common solvent, for producing a mixed solution, and coating the mixed solution on the substrate and the protective layer.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are examples and explanatory and are intended to provide further explanation of the disclosure as claimed.

BRIEF DESCRIPTION OF THE DRAWINGS

The accompanying drawings, which are included to provide a further understanding of the invention and are incorporated in and constitute a part of this specification, illustrate implementations of the invention and together with the description serve to explain the principles of the invention.

Figure 1:
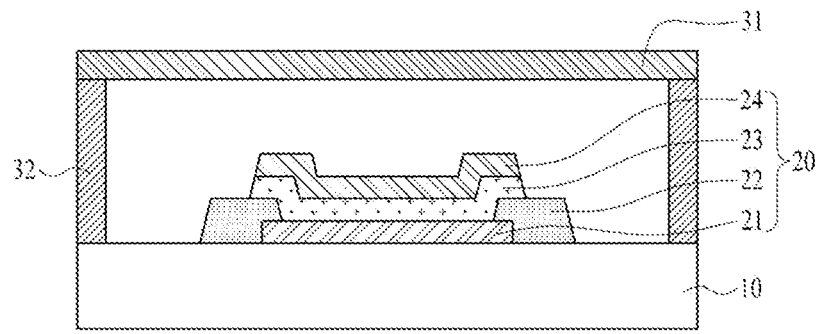
FIG. 1 is a cross-sectional view of a related art organic light emitting display apparatus having a first-type encapsulation structure.
Figure 2:
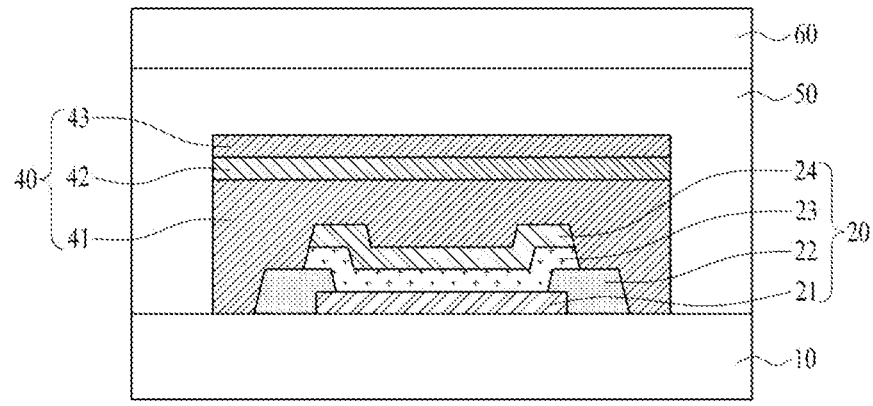
FIG. 2 is a cross-sectional view of a related art organic light emitting display apparatus having a second-type encapsulation structure.
Figure 3:
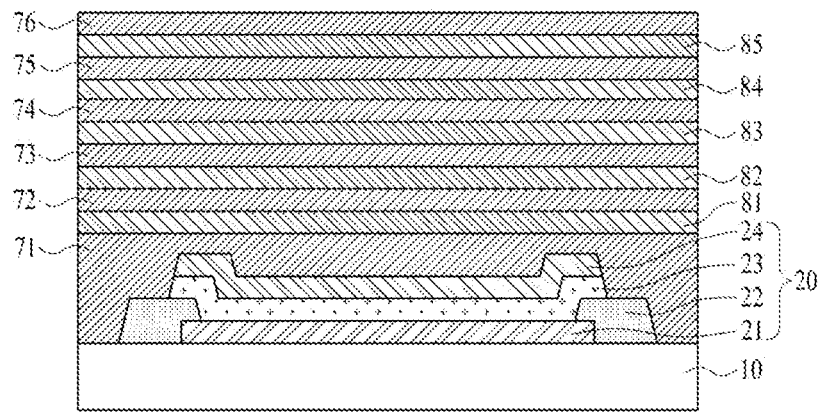
FIG. 3 is a cross-sectional view of a related art organic light emitting display apparatus having a third-type encapsulation structure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present invention, examples of which are illustrated in the accompanying drawings. In the following description, when a detailed description of well-known functions or configurations related to this document is determined to unnecessarily cloud a gist of the invention, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

The term "functionalized graphene" used herein denotes graphene having a hydrophilic group.

Hereinafter, embodiments will be described in detail with reference to the accompanying drawings.

Figure 4:
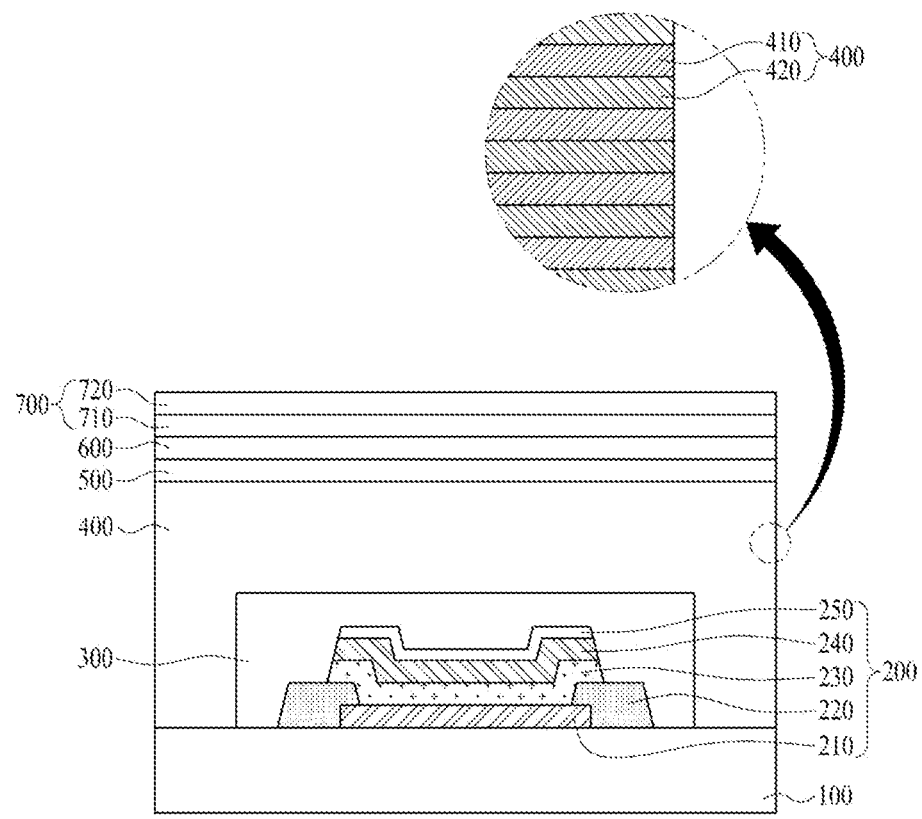
FIG. 4 is a cross-sectional view of an organic light emitting display apparatus according to an embodiment.
Figure 5:
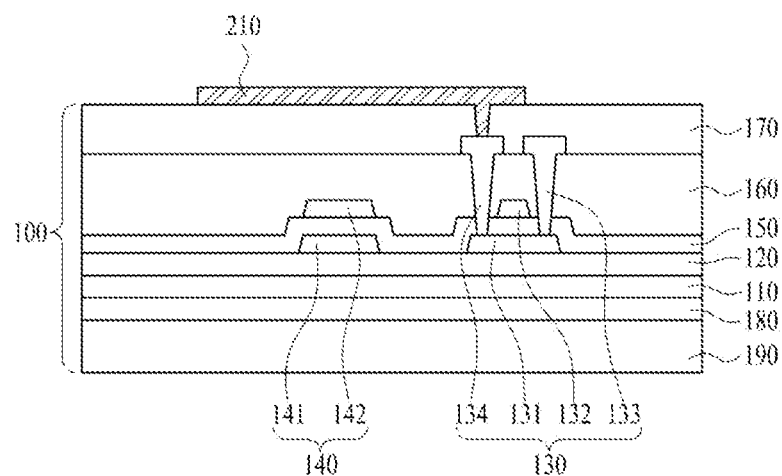
FIG. 5 is a cross-sectional view of a TFT substrate according to an embodiment.

FIG. 4 is a cross-sectional view of an organic light emitting display apparatus according to an embodiment. FIG. 5 is a cross-sectional view of a TFT substrate according to an embodiment.

The organic light emitting display apparatus according to an embodiment may include a TFT substrate 100 including a plurality of TFTs, an organic light-emissive device 200 on the TFT substrate 100, and an encapsulation layer 400 formed on the TFT substrate 100 and the organic light-emissive device 200 to cover the organic light-emissive device 200.

According to an embodiment, as illustrated in the FIG. 4 example, the organic light emitting display apparatus may further include a protective layer 300 between the organic light-emissive device (OLED) 200 and the encapsulation layer 400, a polarizer 500 on the encapsulation layer 400, and a front module 700 adhered to the polarizer 500 by an adhesive layer 600 disposed between the front module 700 and the polarizer 500.

As illustrated in the FIG. 5 example, the TFT substrate 100 according to an embodiment may include a polyimide film 110, a buffer layer 120 on one surface of the polyimide film 110, a TFT 130 and a capacitor 140 disposed on the buffer layer 120, and a rear plate 190 adhered to the other surface of the polyimide film 110 by an adhesive layer 180 disposed between the rear plate 190 and the other surface of the polyimide film 110.

The TFT 130 may include a semiconductor layer 131, a gate electrode 132, a source electrode 133, and a drain electrode 134. The capacitor 140 may include a lower electrode 141 and a capacitor upper electrode 142.

A gate insulating layer 150 may be disposed between the semiconductor layer 131 and the gate electrode 132, and between the capacitor lower electrode 141 and the capacitor upper electrode 142. An inter-layer dielectric 160 may be disposed on the capacitor upper electrode 141, and between the gate electrode 131 and the source and drain electrodes 133, 134. An overcoat layer 170 may be disposed on the inter-layer dielectric 160 and the source and drain electrodes 133, 134 for protecting the TFT 130 and the capacitor 140, and for planarizing a step height caused by the TFT 130. A first electrode 210 of the organic light-emissive device 200 may be electrically connected to the drain electrode 134 of the TFT 130 through a hole formed in the overcoat layer 170.

The TFT substrate 100 of the FIG. 5 example may have a structure for implementing a flexible display apparatus, and may include a top-gate TFT in which the gate electrode 132 is disposed on the semiconductor layer 131, but embodiments are not limited thereto. For example, the TFT substrate 100 may include a bottom-gate TFT in which the gate electrode 132 is disposed under the semiconductor layer 131, and may have a non-flexible structure.

Figure 6:
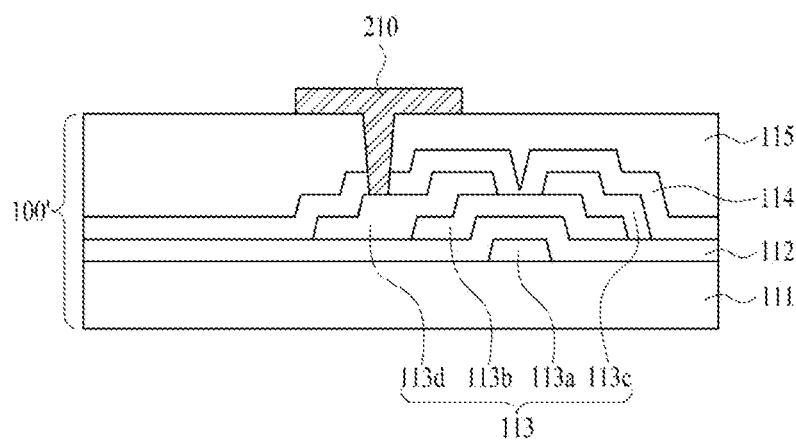
FIG. 6 is a cross-sectional view of a TFT substrate according to an embodiment.

For example, as illustrated in the FIG. 6 example, a TFT substrate 100' may include a substrate 111 formed, e.g., of a glass or plastic material, a gate electrode 113a on the substrate 111, a gate insulating layer 112 on the substrate 111 and the gate electrode 113a, a semiconductor layer 113b that may overlap the gate electrode 113a with the gate insulating layer 112 therebetween, a source electrode 113c and a drain electrode 113d (formed on the gate insulating layer 112 and the semiconductor layer 113b to be separated from each other), and an inorganic insulating layer 114 and an organic insulating layer 115 that are sequentially formed on the substrate 111 with the TFT 113 formed thereon. The first electrode 210 of the organic light-emissive device 200 may be electrically connected to the drain electrode 113d of the TFT 113 through a hole which may be formed in the inorganic insulating layer 114 and the organic insulating layer 115.

Hereinafter, the organic light-emissive device 200 on the TFT substrate 100 will be described in more detail with reference to the FIG. 4 example.

The organic light-emissive device 200 according to an embodiment may include a first electrode 210 on the TFT substrate 100, a bank layer 220 on the TFT substrate 100 with the first electrode 210 disposed thereon, a light-emissive organic layer 230 on a portion of the first electrode 210 exposed through the bank hole of the bank layer 220, a second electrode 240 on the light-emissive organic layer 230, and a capping layer 250 on the second electrode 240. The bank layer 220 may include a bank hole which exposes at least one portion of the first electrode 210 corresponding to a light-emissive area.

The first electrode 210 may be electrically connected to the TFT 130 (e.g., to the drain electrode 134) of the TFT substrate 100. The first electrode 210 may be an anode electrode, and may be formed of a transparent conductive material, which may have a high work function, such as indium tin oxide (ITO), indium zinc oxide (IZO), indium tin zinc oxide (ITZO), indium cerium oxide (ICO), or ZnO.

The bank hole of the bank layer 220 may define a light-emissive area by exposing at least one portion of the first electrode 210. The light-emissive organic layer 230 (which may be disposed on a portion of each of the first electrode 210 and bank layer 220 exposed through the bank hole of the bank layer 220) may include a light-emissive layer, a hole injection layer and/or a hole transport layer between the first electrode 210 and the light-emissive layer, and an electron injection layer and/or an electron transport layer between the second electrode 240 and the light-emissive layer.

The second electrode 240 disposed on the light-emissive organic layer 230 may be a cathode electrode, and may be formed of aluminum (Al), magnesium (Mg), calcium (Ca), silver (Ag), or an alloy thereof, which may have a low work function.

The organic light emitting display apparatus according to an embodiment may be a bottom-emission type, in which light emitted from the light-emissive organic layer 230 passes through the TFT substrate 100, or a top-emission type in which the light emitted from the light-emissive organic layer 230 passes through the front module 700. In the bottom-emission type, the second electrode 240 may have a sufficient thickness that enables light to be reflected.

On the other hand, in the top-emission type, the second electrode 240 may have a thin thickness (for example, 1 to 50 Å) that enables light to be transmitted. A reflective layer (not shown) formed of Al, Ag, or nickel (Ni) may be disposed under the first electrode 210. Also, as illustrated in the FIG. 4 example, the capping layer 250 may be formed on the second electrode 240. The capping layer 250 may prevent light, emitted from the light-emissive organic layer 230, from being totally reflected from a top of the second electrode 240, and may be formed of a mixture of a conductive inorganic material and an organic material. The conductive inorganic material may use, for example, a transition metal, an alkali metal, an alkali earth metal, a rare-earth metal, and/or an alloy of two or more thereof. The organic material may use an organic material (for example, a material which is usable as a host material of the hole transport layer) having good hole mobility or an organic material (for example, a material which is usable as a host material of the electron transport layer) having good electron mobility. The conductive inorganic material may causes a surface plasmon resonance in the capping layer 250 to increase scattering and absorption of light and to prevent the light from being totally reflected from the top of the second electrode 240, thereby enhancing a light extraction effect of the organic light emitting display apparatus.

The organic light emitting display apparatus according to an embodiment, as illustrated in the FIG. 4 example, may include the encapsulation layer 400 on the TFT substrate 100 and the organic light-emissive device 200 to cover the organic light-emissive device 200. The encapsulation layer 400 may prevent water or oxygen from penetrating into the light-emissive organic layer 230, and thus may entirely cover the organic light-emissive device 200.

The encapsulation layer 400 may include a hybrid material formed from a block copolymer and functionalized graphene. As described above, the functionalized graphene denotes graphene having a hydrophilic group.

Graphene has a two-dimensional (2D) honeycomb structure composed of $sp^2$ carbon atoms. Graphene has a very stable structure in which a single bond and a double bond are conjugated, and has good mechanical strength, flexibility, and light transmittance. Therefore, graphene is a material suitable for an encapsulation structure of the organic light emitting display apparatus. Above all, a carbon chain size of graphene is less than a diameter of a water molecule, and thus, graphene has very excellent water/oxygen cutoff characteristic.

The block copolymer has a self-assembly characteristic for minimizing thermodynamic energy. A uniform micro-phase separation of blocks is caused by the self-assembly, and micro-domains having a size of several nanometers (nm) to tens of nm may be formed. Various types of micro-structures including a lamellar structure suitable for the encapsulation structure of the organic light emitting display apparatus may be formed through the self-assembly of the block copolymer. The type of the micro-structure of the block copolymer formed through the self-assembly may be controlled by adjusting a volume fraction of a homopolymer forming each block. That is, the block copolymer being self-assembled to a certain type of micro-structure may be induced by adjusting a volume fraction of homopolymers.

Embodiments may have a feature in that the encapsulation layer 400 is formed of a hybrid material that is formed by chemical bonding of the functionalized graphene and the block copolymer, and thus, a very good barrier characteristic of graphene is applied to self-assembly induction technology of the block copolymer.

The encapsulation layer 400 having a multi-layer structure (e.g., the lamellar structure) may be formed by inducing the self-assembly of the block copolymer to the lamellar structure, which is suitable for the encapsulation structure of the organic light emitting display apparatus, and chemically bonding the functionalized graphene to the homopolymers forming odd layers or even layers of the lamellar structure.

Hereinafter, the lamellar structure of the encapsulation layer 400 according to an embodiment will be described in more detail with reference to the FIG. 4 example.

The block copolymer according to an embodiment, which is chemically bonded to the functionalized graphene, may include at least one hydrophilic homopolymer and at least one hydrophobic homopolymer. For example, the block copolymer may be a block copolymer (PS-b-PEO) of polystyrene and polyethylene oxide, a block copolymer (PS-b-PDMS) of polystyrene and polydimethylsiloxane, a block copolymer (PI-b-PEO) of polyimide and polyethylene oxide, or a mixture of two or more thereof. The hydrophilic group of the functionalized graphene may be chemically bonded to the hydrophilic homopolymer of the block copolymer.

The encapsulation layer 400 may include a first layer 410, which may be formed by chemical bonding of the functionalized graphene and the hydrophilic homopolymer (for example, PEO or PDMS), and a second layer 420 including the hydrophobic homopolymer (for example, PS or PI). According to an embodiment, the encapsulation layer 400 may have a lamellar structure in which the first and second layers 410 and 420 are alternately stacked at least twice or more.

The encapsulation layer 400 according to an embodiment formed by coating or printing a liquid material has a good step coverage characteristic, and thus, all the first and second layers 410 and 420 configuring the encapsulation layer 400 can prevent oxygen/water from penetrating through a side of the organic light emitting display apparatus as well as from penetrating through a face thereof. Because the good step coverage characteristic of the encapsulation layer 400 is added to the good barrier characteristic of graphene itself, the organic light emitting display apparatus according to en embodiment has a more enhanced water/oxygen cutoff characteristic than that of the related art. Moreover, the encapsulation layer 400 according to an embodiment includes graphene having a good bending characteristic, thereby giving better flexibility to the organic light emitting display apparatus.

As illustrated in the example of FIG. 4, the organic light emitting display apparatus according to an embodiment may further include the protective layer 300 between the organic light-emissive device 200 and the encapsulation layer 400. The protective layer 300 may be formed of a material containing, e.g., one or more of $Al_2O_3$, $SiO_2$, $Si_3N_4$, SiON, AlON, AlN, $TiO_2$, ZrO, ZnO, and $Ta_2O_5$.

The protective layer 300 is a layer for minimizing an influence of the solvent (a common solvent of the functionalized graphene and the block copolymer, for example, propylene glycol monomethyl ether acetate (PGMEA), toluene, or the like), which may be used to form the encapsulation layer 400, on the light-emissive organic layer 230 of the organic light-emissive device 200. To this end, according to an embodiment, the protective layer 300 may be formed on the TFT substrate 100 and the organic light-emissive device 200 to entirely cover the organic light-emissive device 200, thereby preventing a direct contact of the organic light-emissive device 200 and the encapsulation layer 400.

As illustrated in the FIG. 4 example, the organic light emitting display apparatus according to an embodiment may further include the polarizer 500 on the encapsulation layer 400, the front module 700, and the adhesive layer 600 therebetween. The polarizer 500 may be provided for preventing a reduction in visibility which may be caused by external light (reflected by the organic light-emissive device 200) being emitted from the organic light emitting display apparatus, and may prevent the external light, reflected by the second electrode 240 of the organic light-emissive device 200, from being emitted from the organic light emitting display apparatus.

The polarizer 500 may include a λ/4 phase difference film on the encapsulation layer 400 and a linear polarization film on the λ/4 phase difference film. The external light is changed to linearly-polarized light by passing through the linear polarization film. The linearly-polarized light may pass through the λ/4 phase difference film, may be reflected by the second electrode 240, may again pass through the λ/4 phase difference film to thereby be changed to linearly-polarized light vertical to a transmissive axis of the linear polarization film, and may be absorbed by the linear polarization film.

The front module 700 may include a touch film 710 and a cover window 720, and may be adhered to the polarizer 500 through the adhesive layer 600. The cover window 710 may be formed of glass or plastic. A pressure sensitive adhesive (PSA), an optically clear adhesive (OCA), or the like may be used for the adhesive layer 600.

Hereinafter, a method of manufacturing the organic light emitting display apparatus according to an embodiment will be described in detail with reference to FIGS. 7 to 13.

Figure 7:
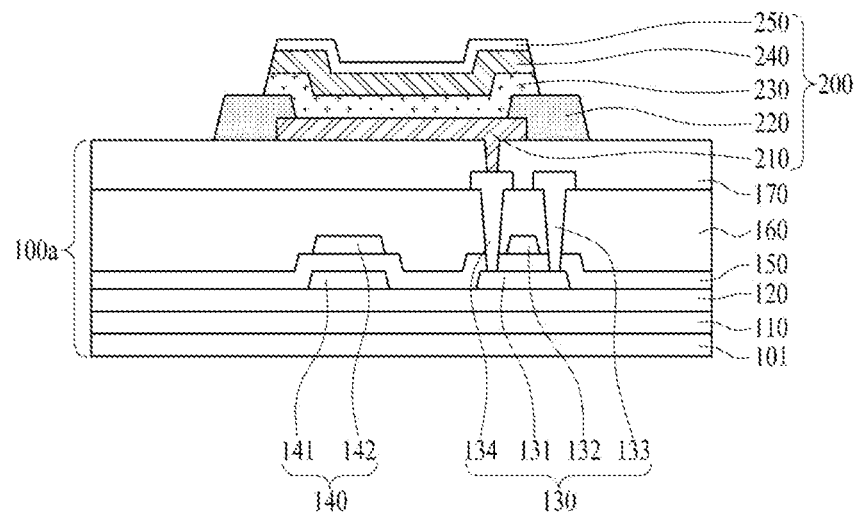
FIGS. 7 to 9 and 11 to 13 are cross-sectional views for describing a method of manufacturing an organic light emitting display apparatus according to an embodiment.

First, as illustrated in the FIG. 7 example, a substrate 100a including a TFT 130 may be prepared, and then, an organic light-emissive device 200 may be formed on the substrate 100a. In order to prepare the substrate 100a, a polyimide film 110 may be formed on a glass substrate 101. Subsequently, a buffer layer 120 may be formed of an inorganic material on the polyimide film 110.

A semiconductor layer 131 and a capacitor lower electrode 141 may be formed on the buffer layer 120 to be separated from each other. The semiconductor layer 131 may be, e.g., amorphous silicon, polycrystalline silicon, or oxide semiconductor.

A gate insulating layer 150 may be formed on the buffer layer 120 on which the semiconductor layer 131 and capacitor lower electrode 141 may be formed. The gate insulating layer 150 may be formed, e.g., of silicon oxide ($SiO_x$) or silicon nitride ($SiN_x$).

A gate electrode 132 and a capacitor upper electrode 142 may be formed on the gate insulating layer 150 to respectively overlap the semiconductor layer 131 and the capacitor lower electrode 141. The gate electrode 132 and the capacitor upper electrode 142 may be formed, e.g., of Al, Mo, Cr, Au, Ti, Ni, Cu, or an alloy of two or more thereof.

Subsequently, an inter-layer dielectric 160 may be formed on the gate insulating layer 150 on which the gate electrode 132 and the capacitor upper electrode 142 may be formed. The inter-layer dielectric 160 may be, e.g, an organic single layer or an inorganic/organic double layer.

Two via holes partially exposing the semiconductor layer 131 may be formed by selectively etching the inter-layer dielectric 160 and the gate insulating layer 150 at both sides of the gate electrode 132 with the gate electrode 132 therebetween. Subsequently, a metal layer may be formed, for example, of Al, Mo, Cr, Au, Ti, Ni, Cu, or an alloy of two or more thereof on the inter-layer dielectric 160. Then, a source electrode 133 and a drain electrode 134 may be formed by performing a photolithography process and an etching process.

An overcoat layer 170 may be disposed on the inter-layer dielectric 160 on which the source and drain electrodes 133 and 134 are formed, for protecting the TFT 130 and the capacitor 140 and for planarizing a step height caused by the TFT 130. The overcoat layer 170 may be, e.g., an organic single layer or an inorganic/organic double layer.

In order to form the organic light-emissive device 200 on the finished substrate 100a, a hole partially exposing the drain electrode 134 may be formed by selectively etching the overcoat layer 170. Subsequently, a transparent conductive material, which may have a high work function, such as ITO, IZO, ITZO, ICO, or ZnO, may be deposited through a CVD or sputtering process. Then, a first electrode 210 may be formed by performing a photolithography process and an etching process. In manufacturing a top-emission type organic light emitting display apparatus, immediately before forming the first electrode 210, a reflective layer (not shown) may be formed of Ag or Ni on the substrate 100a.

An organic insulating layer may be formed of an organic non-conductive material, such as benzocyclobutene (BCB), an acrylic resin, an epoxy resin, a polyamide resin, or a polyimide resin, on the substrate 100a with the first electrode 210 formed thereon. Then, a bank layer 220 partially exposing at least one portion of the first electrode 210 may be formed by performing a selective etching process.

Subsequently, through a general method, a light-emissive organic layer 230, a second electrode 240, and a capping layer 250 may be sequentially formed on the bank layer 220 and the first electrode 210. The second electrode 240 disposed on the light-emissive organic layer 230 may be formed, e.g., of aluminum (Al), magnesium (Mg), calcium (Ca), silver (Ag), or an alloy thereof, which may have a low work function. In manufacturing a bottom-emission type organic light emitting display apparatus, the second electrode 240 may have a sufficient thickness that enables light to be reflected. On the other hand, in manufacturing the top-emission type organic light emitting display apparatus, the second electrode 240 may have a thin thickness (for example, 1 to 50 Å) that enables light to be transmitted.

A capping layer 250 for preventing light, emitted from the light-emissive organic layer 230, to be totally reflected from a top of the second electrode 240 may be formed on the second electrode 240. The capping layer 250 may have a thickness of about 10 nanometers (nm) or about 100 nm.

As described above, the capping layer 250 may be formed of a mixture of a conductive inorganic material and an organic material. The conductive inorganic material may use, for example, a transition metal, a alkali metal, an alkali earth metal, a rare-earth metal, and/or an alloy of two or more thereof. For example, when a silver nanoparticle is used as the conductive inorganic material, silver nanoparticles and organic materials may be sprayed and deposited on the second electrode 240, thereby forming the capping layer 250. A content of silver nanoparticles included in the capping layer 250 may be 10 percent by weight (wt %) or less.

Figure 8:
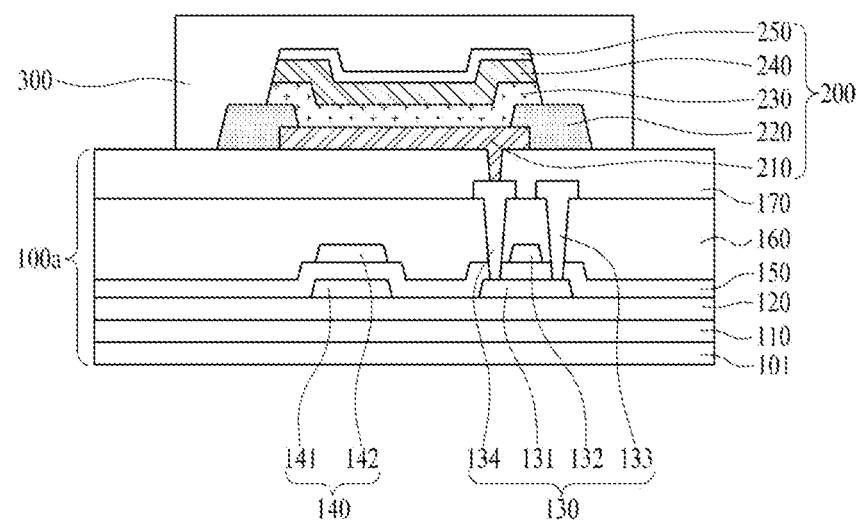

Subsequently, as illustrated in the FIG. 8 example, a protective layer 300 may be formed on the TFT substrate 10 and the organic light-emissive device 20 to entirely cover the organic light-emissive device 20. The protective layer 300 may be formed, e.g., of a material containing one or more of $Al_2O_3$, $SiO_2$, $Si_3N_4$, SiON, AlON, AlN, $TiO_2$, ZrO, ZnO, and $Ta_2O_5$. Because there is a risk of damaging the light-emissive organic layer 230 under a high temperature of 100° (degrees) C. or more, the protective layer 300 may be formed by performing a plasma-enhanced chemical vapor deposition (PECVD) or ALD process under a low temperature of 8020 C. to 100° C.

Figure 9:
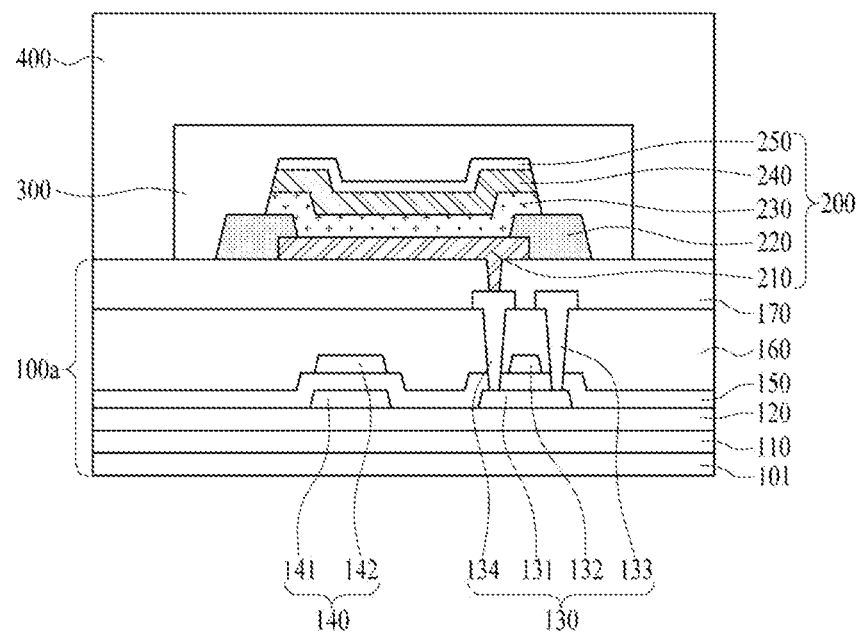

Subsequently, as illustrated in the FIG. 9 example, an encapsulation layer 400 may be formed on the substrate 100a and on the protective layer 300 to cover the protective layer 300. According to an embodiment, an operation of forming the encapsulation layer may include an operation of mixing the functionalized graphene and the block copolymer in a common solvent for producing a mixed solution and an operation of coating the mixed solution on the substrate 100a and the protective layer 400.

The functionalized graphene may be produced by using various known methods (for example, a Hummers method that is one of representative methods of producing graphene oxide (GO)) of producing GO.

According to an embodiment, the functionalized graphene may be produced as follows:

1) Expanded graphite is put into a sulfate solution, and slurry is produced;

2) Potassium permanganate is gradually added while stirring the slurry, and simultaneously, a cooling process is performed to maintain a temperature of the solution at 20° (degrees) C. or less, for preventing explosion caused by the addition of the potassium permanganate;

3) The slurry is stirred for about two hours under about 35° (degrees) C., and distilled water is added;

4) To remove metal ions from the slurry, the slurry is washed with 1:10 hydrochloric acid, and filtered;

5) To neutralize a paste obtained in this way, a process in which the paste is put into distilled water, stirred, and filtered is repeated twice or three times; and 6) Remaining graphite oxide (e.g., unexfoliated graphite oxide) is removed by centrifuging a neutralized oxide graphene solution at about 4,000 RPM (revolutions per minute) or more.

As described above, the Hummers method uses potassium permanganate and sulfate. The potassium permanganate is an oxidant which is generally used, but an active species that actually oxidizes expanded graphite is dimanganese heptoxide. The dimanganese heptoxide is produced by an action between potassium permanganate and sulfate as follows:

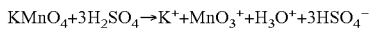

$KMnO_4 + 3H_2SO_4 \rightarrow K^+ + MnO_3^+ + H_3O^+ + 3HSO_4^-$

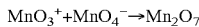

$MnO_3^+ + MnO_4^- \rightarrow Mn_2O_7$

Figure 10:
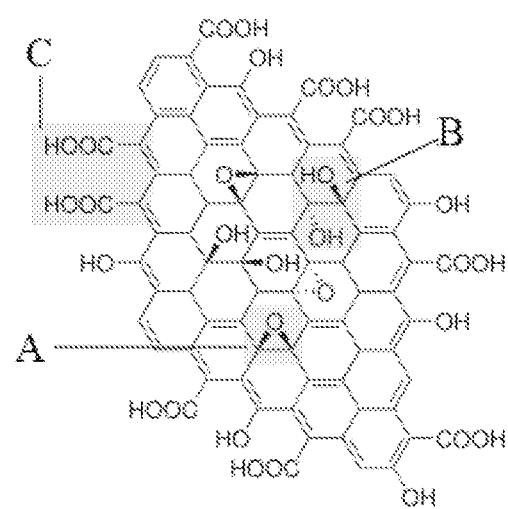
FIG. 10 is a chemical structural formula of functionalized graphene according to an embodiment.

FIG. 10 is a chemical structural formula of functionalized graphene according to an embodiment. As illustrated in FIG. 10, the functionalized graphene according to the present invention may include an epoxy group (A), a hydroxyl group (B), and/or a carboxyl group (C) as a hydrophilic group.

The block copolymer according to an embodiment may include at least one hydrophilic homopolymer and at least one hydrophobic homopolymer. For example, the block copolymer may be a block copolymer (PS-b-PEO) of polystyrene and polyethylene oxide, a block copolymer (PS-b-PDMS) of polystyrene and polydimethylsiloxane, a block copolymer (PI-b-PEO) of polyimide and polyethylene oxide, or a mixture of two or more thereof The type of the micro-structure of the block copolymer formed through the self-assembly may be controlled by adjusting a volume fraction of a homopolymer forming each block. Therefore, according to an embodiment, the block copolymer being self-assembled to the lamellar structure suitable for the encapsulation structure of the organic light emitting display apparatus may be induced by adjusting a volume fraction of the homopolymers.

According to an embodiment, a volume fraction of the hydrophilic homopolymer in the block copolymer may be 0.3 to 0.7. In particular, when the block copolymer is the block copolymer (PS-b-PEO) of polystyrene and polyethylene oxide or the block copolymer (PI-b-PEO) of polyimide and polyethylene oxide, the volume fraction of the hydrophilic homopolymer (i.e., polyethylene oxide (PEO)) in the block copolymer may be 0.4 to 0.5.

As described above, the block copolymer (of which the volume fraction of the hydrophilic homopolymer is adjusted to be self-assembled in the lamellar structure) and the functionalized graphene having the hydrophilic group may be mixed in a common solvent, thereby producing a mixed solution. The common solvent may be a solvent having miscibility with the functionalized graphene and the block copolymer, and for example, may include PGMEA, toluene, or the like.

The mixed solution may be coated on the substrate 100a and the protective layer 400. Then, the encapsulation layer 400 may be formed by performing an annealing process. The coating of the mixed solution may be performed, for example, by a spin coating process, a slot die coating process, a slit coating process, a drop casting process, or an inkjet printing process.

The annealing process may be performed for 0.5 hours to 1 hour under a normal temperature to about 80° (degrees) C. by using a saturated organic solvent vapor (for example, saturated acetone or toluene) such as acetone or toluene.

According to the above-described method, the encapsulation layer 400 may have the lamellar structure in which the first layer 410, which may be formed by the chemical bonding of the functionalized graphene and the hydrophilic homopolymer (for example, PEO or PDMS), and the second layer 420 including the hydrophobic homopolymer (for example, PS or PI) may be alternately stacked at least twice or more.

The encapsulation layer 400 according to an embodiment which is formed by a coating or printing process in a liquid state may have a good step coverage characteristic, thereby further enhancing the water/oxygen cutoff characteristic of the organic light emitting display apparatus.

Moreover, according to embodiments, because the encapsulation layer 400 having the multi-layer lamellar structure may be formed by performing only a one-time coating process without performing a CVD process which requires expensive equipment and time to create a vacuum environment, the manufacturing process can be innovatively simplified, manufacturing time can be considerably shortened, and manufacturing cost can be considerably reduced.

Figure 11:
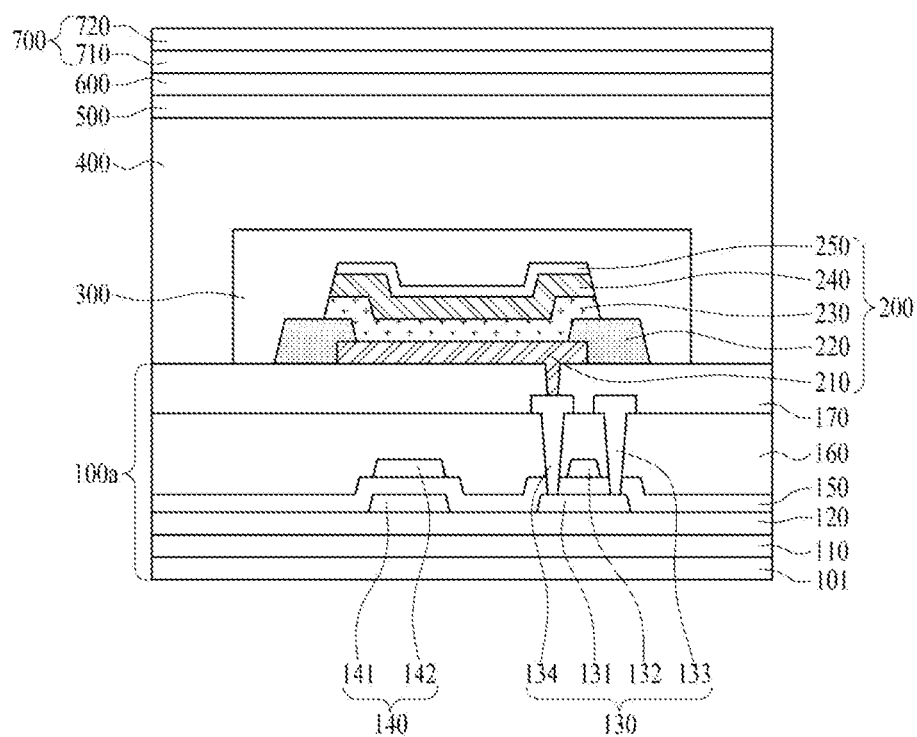

After the encapsulation layer 400, as illustrated in the FIG. 11 example, the polarizer 500 may be adhered to the encapsulation layer 400. Then, the front module 700 including the touch film 710 and the cover window 720 may be adhered to the polarizer 500 through the adhesive layer 600 such as a PSA or an OCA.

Figure 12:
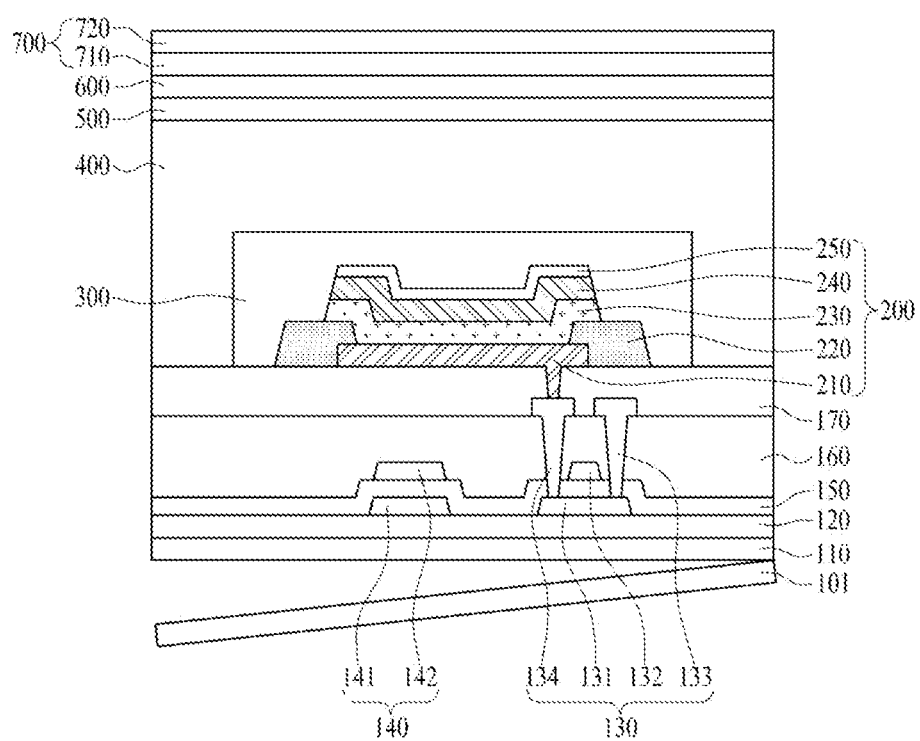
Figure 13:
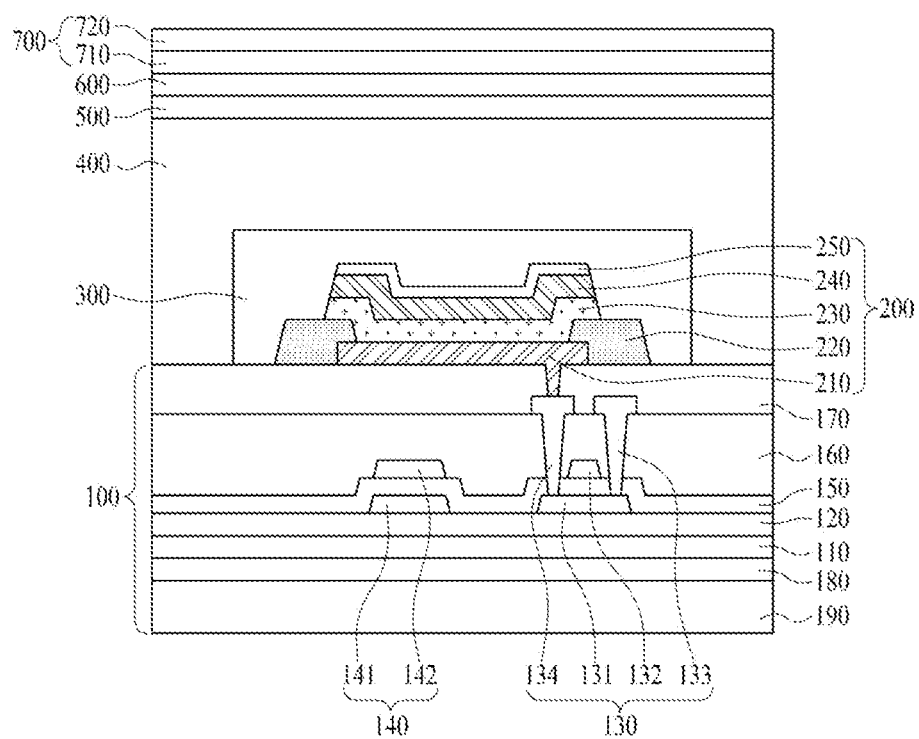

Subsequently, as illustrated in the FIG. 12 example, the glass substrate 101 performing a support function in a manufacturing process may be separated from the polyimide film 110, e.g., by using a laser. For such a separation process, heating and dissolving may be performed by absorbing an irradiated laser. Thus, a sacrificial layer (not shown) enabling the separation between the glass substrate 101 and the polyimide film 110 may be further formed between the glass substrate 101 and the polyimide film 110.

The glass substrate 101 may be separated from the polyimide film 110. Then, as illustrated in the FIG. 13 example, the rear plate 190 for supporting the organic light emitting display apparatus may be adhered to the polyimide film 110 through the adhesive layer 180, which may be, for example, a PSA or an OCA.

According to embodiments, external water and oxygen may be completely cut off, and a reliability and service life of the organic light emitting display apparatus may increase. Moreover, a flexibility of the organic light emitting display apparatus may be enhanced. Thus, a next-generation flexible display apparatus and foldable display apparatus bendable at a larger curvature radius may be implemented.

Moreover, the organic light emitting display apparatus with an excellent cutoff of water/oxygen and good flexibility may be manufactured with a thinner thickness that the related art apparatus. Moreover, according to embodiments, the organic light emitting display apparatus with an excellent cutoff of water/oxygen and good flexibility may be manufactured through a relatively simple process at relatively low cost.

The block copolymer may include at least one hydrophilic homopolymer and at least one hydrophobic homopolymer, and the encapsulation layer may include: a first layer formed by chemical bonding of the functionalized graphene and the hydrophilic homopolymer; and a second layer including the hydrophobic homopolymer. The encapsulation layer may have a lamellar structure in which the first and second layers are alternately stacked at least twice or more. The block copolymer may be a block copolymer of polystyrene and polyethylene oxide, a block copolymer of polystyrene and polydimethylsiloxane, a block copolymer of polyimide and polyethylene oxide, or a mixture of two or more thereof The organic light emitting display apparatus according to an embodiment may further include a protective layer between the organic light-emissive device and the encapsulation layer. The protective layer may be formed on the TFT substrate and the organic light-emissive device to entirely cover the organic light-emissive device, and may prevent a direct contact of the organic light-emissive device and the encapsulation layer. The protective layer may be formed, e.g., of a material containing one or more of $Al_2O_3$, $SiO_2$, $Si_3N_4$, SiON, AlON, AlN, $TiO_2$, ZrO, ZnO, and $Ta_2O_5$.

The block copolymer may include at least one hydrophilic homopolymer and at least one hydrophobic homopolymer. A volume fraction of the hydrophilic homopolymer in the block copolymer may be 0.3 to 0.7. The block copolymer may be a block copolymer of polystyrene and polyethylene oxide, a block copolymer of polystyrene and polydimethylsiloxane, a block copolymer of polyimide and polyethylene oxide, or a mixture of two or more thereof. The block copolymer may be a block copolymer of polystyrene and polyethylene oxide or a block copolymer of polyimide and polyethylene oxide. A volume fraction of the hydrophilic homopolymer in the block copolymer may be 0.4 to 0.5.

A method of manufacturing an apparatus according to an embodiment may further include annealing the coated mixed solution. The annealing may be performed by using a saturated organic solvent vapor. The coating of the mixed solution may be performed, for example, by a spin coating process, a slot die coating process, a slit coating process, a drop casting process, or an inkjet printing process.

It will be apparent to those skilled in the art that various modifications and variations can be made in the present invention without departing from the spirit or scope of the invention. Thus, it is intended that embodiments of the present invention cover the modifications and variations of this invention provided they come within the scope of the appended claims and their equivalents.

What is claimed is:

1. An organic light emitting display apparatus, comprising:
a thin film transistor (TFT) substrate comprising a plurality of thin film transistors;
an organic light-emissive device on the TFT substrate; and
an encapsulation layer on the TFT substrate and the organic light-emissive device, the encapsulation layer being configured to cover the organic light-emissive device, the encapsulation layer comprising a hybrid material comprising:
a block copolymer; and
functionalized graphene,
wherein:
the block copolymer comprises:
a hydrophilic homopolymer, and
a hydrophobic homopolymer, and
the encapsulation layer comprises:
a first layer comprising the functionalized graphene and the hydrophilic homopolymer, chemically bonded, and
a second layer comprising the hydrophobic homopolymer.

2. The organic light emitting display apparatus of claim 1, wherein the encapsulation layer comprises a lamellar structure, such that the first and second layers are alternately stacked at least twice or more.

3. The organic light emitting display apparatus of claim 1, wherein the block copolymer comprises a block copolymer of polystyrene and polyethylene oxide, a block copolymer of polystyrene and polydimethylsiloxane, a block copolymer of polyimide and polyethylene oxide, or a mixture of two or more thereof.

4. The organic light emitting display apparatus of claim 1, further comprising a protective layer between the organic light-emissive device and the encapsulation layer.

5. The organic light emitting display apparatus of claim 4, wherein the protective layer is disposed on the TFT substrate and the organic light-emissive device, the protective layer being configured to:
entirely cover the organic light-emissive device; and
prevent a direct contact of the organic light-emissive device and the encapsulation layer.

6. The organic light emitting display apparatus of claim 5, wherein the protective layer comprises a material containing one or more of $Al_2O_3$, $SiO_2$, $Si_3N_4$, SiON, AlON, AlN, $TiO_2$, ZrO, ZnO, and $Ta_2O_5$.

7. A method of manufacturing an organic light emitting display apparatus, the method comprising:
preparing a substrate comprising a plurality of thin film transistors;
providing an organic light-emissive device on the substrate;
providing a protective layer on the substrate and the organic light-emissive device to cover the organic light-emissive device; and
forming an encapsulation layer on the substrate and the protective layer to cover the protective layer, the forming of the encapsulation layer comprising:
mixing functionalized graphene and a block copolymer in a common solvent, for producing a mixed solution; and
coating the mixed solution on the substrate and the protective layer,
wherein:
the block copolymer comprises:
a hydrophilic homopolymer; and
a hydrophobic homopolymer; and
a volume fraction of the hydrophilic homopolymer in the block copolymer is 0.3 to 0.7.

8. A method of manufacturing an organic light emitting display apparatus, the method comprising:
preparing a substrate comprising a plurality of thin film transistors;
providing an organic light-emissive device on the substrate;
providing a protective layer on the substrate and the organic light-emissive device to cover the organic light-emissive device; and
forming an encapsulation layer on the substrate and the protective layer to cover the protective layer, the forming of the encapsulation layer comprising:
mixing functionalized graphene and a block copolymer in a common solvent, for producing a mixed solution; and
coating the mixed solution on the substrate and the protective layer, wherein the block copolymer comprises a block copolymer of polystyrene and polyethylene oxide, a block copolymer of polystyrene and polydimethylsiloxane, a block copolymer of polyimide and polyethylene oxide, or a mixture of two or more thereof.

9. The method of claim 7, wherein:
the block copolymer comprises a block copolymer of polystyrene and polyethylene oxide or a block copolymer of polyimide and polyethylene oxide; and
a volume fraction of the hydrophilic homopolymer in the block copolymer is 0.4 to 0.5.

10. The method of claim 7, further comprising annealing the coated mixed solution.

11. The method of claim 10, wherein the annealing is performed by using a saturated organic solvent vapor.

12. The method of claim 7, wherein the coating of the mixed solution is performed by a spin coating process, a slot die coating process, a slit coating process, a drop casting process, or an inkjet printing process.

* * * * *